(12) United States Patent
Kim et al.

(10) Patent No.: US 7,685,704 B2
(45) Date of Patent: Mar. 30, 2010

(54) METHOD FOR MANUFACTURING BUMP OF PROBE CARD

(75) Inventors: Bong Hwan Kim, Seoul (KR); Jong Bok Kim, Goyang-si (KR)

(73) Assignee: Will Technology Co., Ltd., Suwon-si (KR)

( * ) Notice: Subject to any disclaimer, the term of this patent is extended or adjusted under 35 U.S.C. 154(b) by 47 days.

(21) Appl. No.: 11/760,004

(22) Filed: Jun. 8, 2007

(65) Prior Publication Data
US 2008/0189942 A1 Aug. 14, 2008

(30) Foreign Application Priority Data
Feb. 12, 2007 (KR) .................... 10-2007-0014484

(51) Int. Cl.
*H01R 9/00* (2006.01)
*H05K 3/00* (2006.01)

(52) U.S. Cl. .............. 29/842; 29/830; 29/840; 29/843; 29/874; 29/884; 438/106; 438/694; 438/736

(58) Field of Classification Search ........... 29/842, 29/830, 840, 843, 874, 882, 884, 889; 438/106, 438/670, 694, 719, 736
See application file for complete search history.

(56) References Cited

U.S. PATENT DOCUMENTS 5,747,358 A * 5/1998 Gorrell et al. .................. 216/11

* cited by examiner

*Primary Examiner*—Thiem Phan
(74) *Attorney, Agent, or Firm*—Sughrue Mion, PLLC

(57) ABSTRACT

A method for manufacturing a bump of a probe card is disclosed. In accordance with the present invention, the bump has a high aspect ratio, a high elasticity, a high durability suitable for testing a high speed device. The bump is formed using a sacrificial substrate as a mold to have a shape of Π or II for elasticity and durability.

9 Claims, 10 Drawing Sheets

METHOD FOR MANUFACTURING BUMP OF PROBE CARD

CROSS REFERENCE TO RELATED APPLICATION

This application claims priority from Korean Patent Application No. 10-2007-0014484 filed on Feb. 12, 2007, in the Korean Intellectual Property Office, the disclosure of which is incorporated herein by reference in its entirety.

BACKGROUND OF THE INVENTION

1. Field of the Invention

The present invention relates to a method for manufacturing a bump of a probe card, and more particularly to a method for manufacturing a bump of a probe card having a high aspect ratio, a high elasticity, a high durability suitable for testing a high speed device by using a sacrificial substrate as a mold.

2. Description of the Related Art

Generally, a probe card is used for a wafer-level test. A plurality of cantilever structures having a bump, a cantilever beam and a probe tip are formed on the probe card. The cantilever beam which is a main body of the cantilever structure provides an elasticity and the probe tip contacts a pad on a wafer. The bump provides a support for the cantilever beam to allow the probe tip to contact the pad elastically.

An integration density of a semiconductor device increases, a density of the cantilever structure is also increased. In order to test various devices, bumps having various heights are required. While the bump having a high aspect ratio allows attaching a chip capacitor close to the bump, it is difficult to form the bump having the high aspect ratio.

In order to overcome this problem, the applicant filed Korean Patent Application No. 10-2006-0079873 titled "METHOD FOR MANUFACTURING BUMP OF PROBE CARD" disclosing a method for forming a bump having the high aspect ratio using a silicon substrate a mold.

One factor for deciding a durability of the probe card is the elasticity of the cantilever structure. The elasticity of the cantilever structure is determined by the elasticity of the probe beam and the bump. Increasing the elasticity of the bump is very difficult, and particularly, forming a bump that satisfies the elasticity and a stiffness is more difficult.

SUMMARY OF THE INVENTION

It is an object of the present invention to provide a method for manufacturing a bump of a probe card having a shape of Π or II suitable for testing of a high speed device.

In accordance with the present invention, there is provided a method for manufacturing a bump of a probe card, the method comprising steps of: (a) forming first and second mask layer patterns on a first and second surfaces of a sacrificial substrate respectively, the first and second mask layer patterns exposing at least a portion of a first bump region where a first bump is to be formed and at least a portion of a second bump region where a second bump is to be formed corresponding to the first bump region, respectively; (b) removing the sacrificial substrate exposed by the first and second mask layer patterns to form the first bump region and the second bump region mutually connected, respectively; (c) removing the first and second mask layer patterns; (d) bonding an insulating substrate to one of the first and second surfaces of the sacrificial substrate; (e) forming first and second bumps filling the first and second bump regions, respectively; and (f) removing the sacrificial substrate.

Preferably, the first mask layer pattern comprises a first mask portion extending from a first side to a second side of the first bump region so as to expose a portion of the first bump region, and the second mask layer pattern comprises a second mask portion extending from a first side to a second side of the second bump region so as to expose a portion of the second bump region.

Preferably, the first mask layer pattern comprises a first mask portion extending from a first side to a second side of the first bump region so as to expose a portion of the first bump region, and the second mask layer pattern exposes an entirety of the second bump region, and wherein the insulating substrate is bonded to the second surface of the sacrificial substrate.

Preferably, the first mask layer pattern exposes an entirety of the first bump region, the second mask layer pattern comprises a second mask portion extending from a first side to a second side of the second bump region so as to expose a portion of the second bump region, and wherein the insulating substrate is bonded to the second surface of the sacrificial substrate.

It is preferable that the method for manufacturing the bump of the probe card in accordance with the present invention further comprises forming an insulating film on the surfaces of the sacrificial substrate.

It is preferable that the method for manufacturing the bump of the probe card in accordance with the present invention further comprises forming a bonding layer at an interface of the sacrificial layer and the insulating substrate.

Preferably, the insulating substrate comprises one of a ceramic substrate, a glass substrate and an insulating silicon substrate.

Preferably, each of the first and second mask layer patterns comprises one of a photoresist film and a TEOS film.

Preferably, the sacrificial substrate comprises one of a silicon substrate and a glass substrate.

BRIEF DESCRIPTION OF THE DRAWINGS

FIGS. 2a and 2b are plane views of FIG. 1a.

DETAILED DESCRIPTION OF THE INVENTION

The present invention will now be described in detail with reference to the accompanied drawings. The interpretations of the terms and wordings used in Description and Claims should not be limited to common or literal meanings. The embodiments of the present invention are provided to describe the present invention more thoroughly for those skilled in the art.

FIGS. 1a through 1f are cross-sectional views illustrating a method for manufacturing a bump of a probe card in accordance with a first embodiment of the present invention.

Figure 1A:
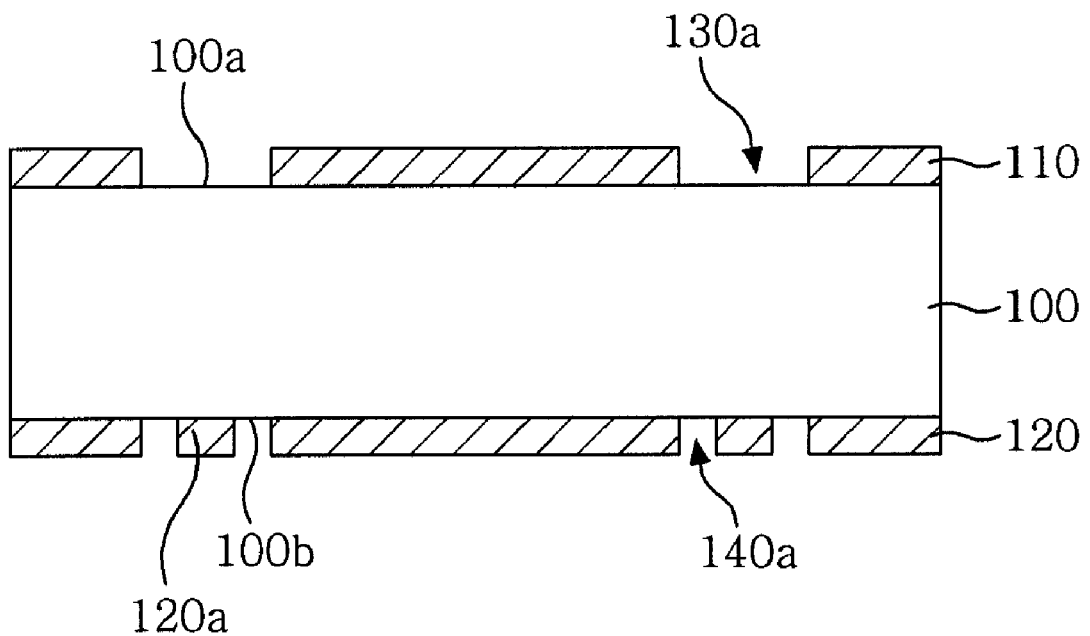
FIGS. 1a through 1f are cross-sectional views illustrating a method for manufacturing a bump of a probe card in accordance with a first embodiment of the present invention.

Referring to FIG. 1a, a first mask layer (not shown) and a second mask layer (not shown) are formed on a first surface 100a and a second surface 100b of a sacrificial substrate 100.

It is preferable that the first mask layer and the second mask layer comprise a photoresist film or a TEOS layer.

Thereafter, the first mask layer and the second mask layer are selectively etched to form a first mask layer pattern 110 and a second mask layer pattern 120, respectively. The first mask layer pattern 110 exposes a first bump region 130a of the first surface 100a of the sacrificial substrate 100 where a first bump 180a is to be formed. The second mask layer pattern 120 exposes at least a portion of a second bump region 140a of the second surface 100b of the sacrificial substrate 100 where a second bump 180b is to be formed corresponding to the first bump region 130a.

Figure 2A:
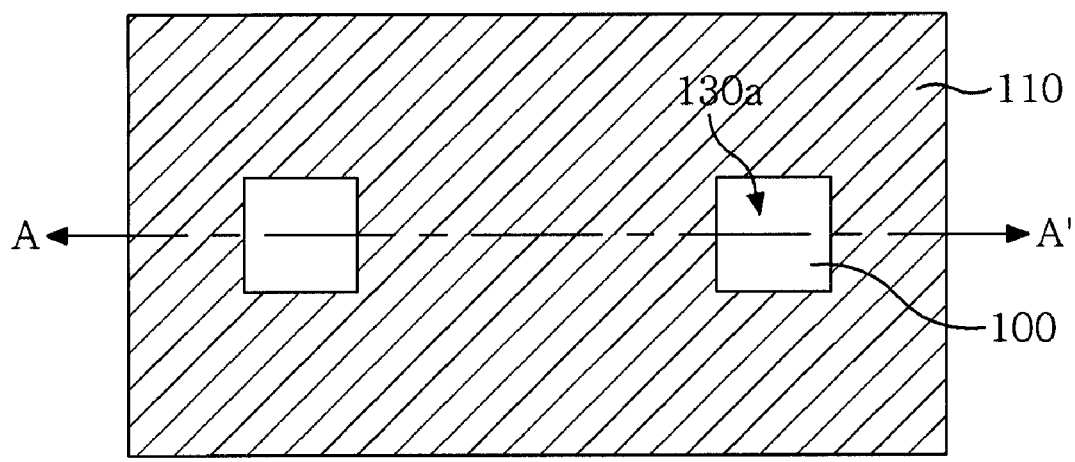
Figure 2B:
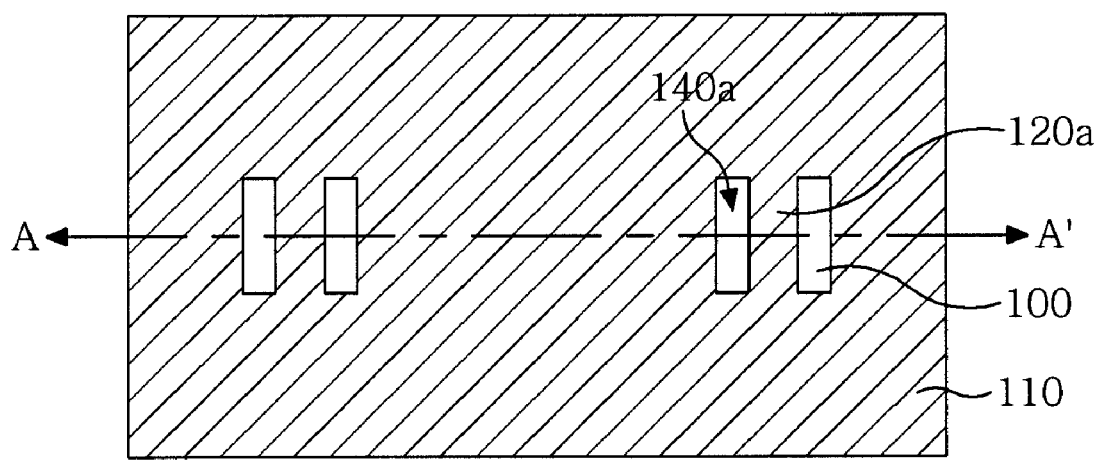

FIG. 2a is a plane view of FIG. 1a from a direction of the first surface 100a. As shown in FIGS. 1a and 2a, the first mask layer pattern 110 exposes an entirety of the first bump region 130a. FIG. 2b is a plane view of FIG. 1a from a direction of the second surface 100b. As shown in FIGS. 1a and 2b, the second mask layer pattern 120 exposes the portion of the second bump region 140a. The second mask layer pattern 120 comprises a second mask portion 120a extending from a first side to a second side of the second bump region 140a. The second mask portion 120a serves as an etching mask during an etching process of the sacrificial substrate 100.

Figure 1B:
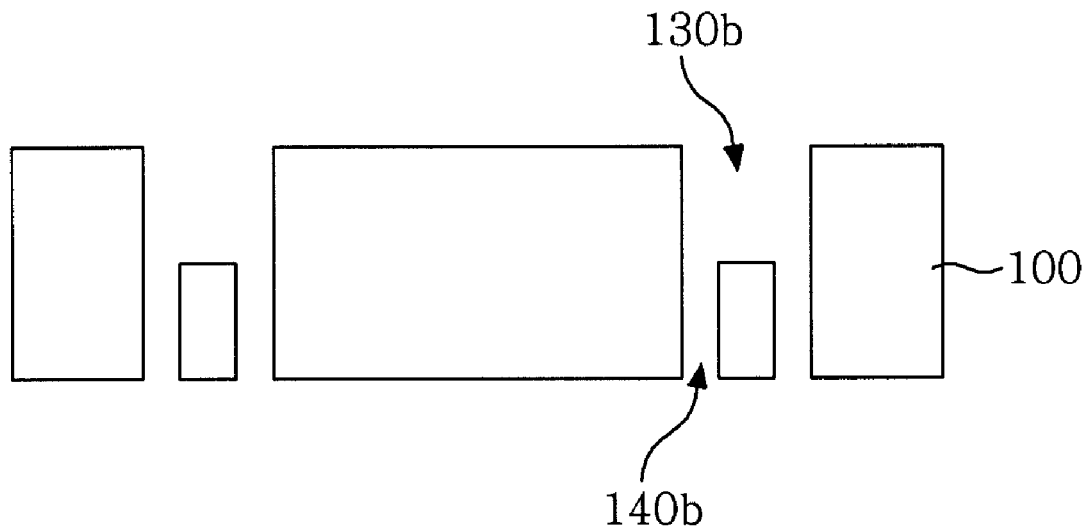

Referring to FIG. 1b, the sacrificial substrate 100 exposed by the first mask layer pattern 110 and the second mask layer pattern 120 is etched to form the first bump region 130a and the second bump region 140a mutually connected.

In the etching process, a first predetermined depth of the sacrificial substrate 100 in the first bump region 130a is etched, and a second predetermined depth of the sacrificial substrate 100 in the second bump region 140a is etched until the first bump region 130a is exposed to form the mutually connected the first bump region 130a and the second bump region 140a.

Thereafter, the first mask layer pattern 110 and the second mask layer pattern 120 are removed.

Figure 1C:
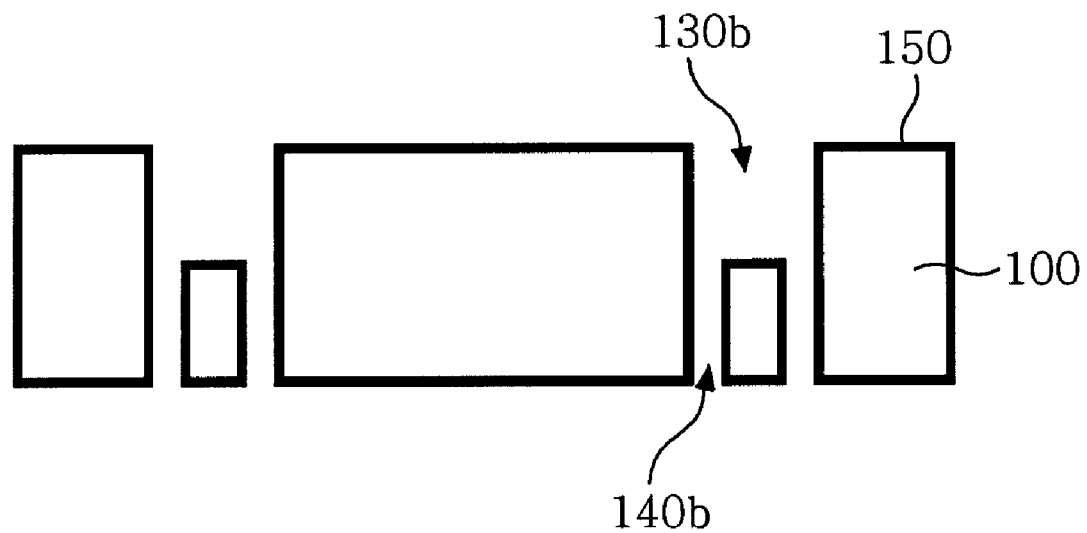

Referring to FIG. 1c, an insulating film 150 is formed on the surfaces of the sacrificial substrate 100. Preferably, the insulating film 150 comprises a nitride film or an oxide film.

Figure 1D:
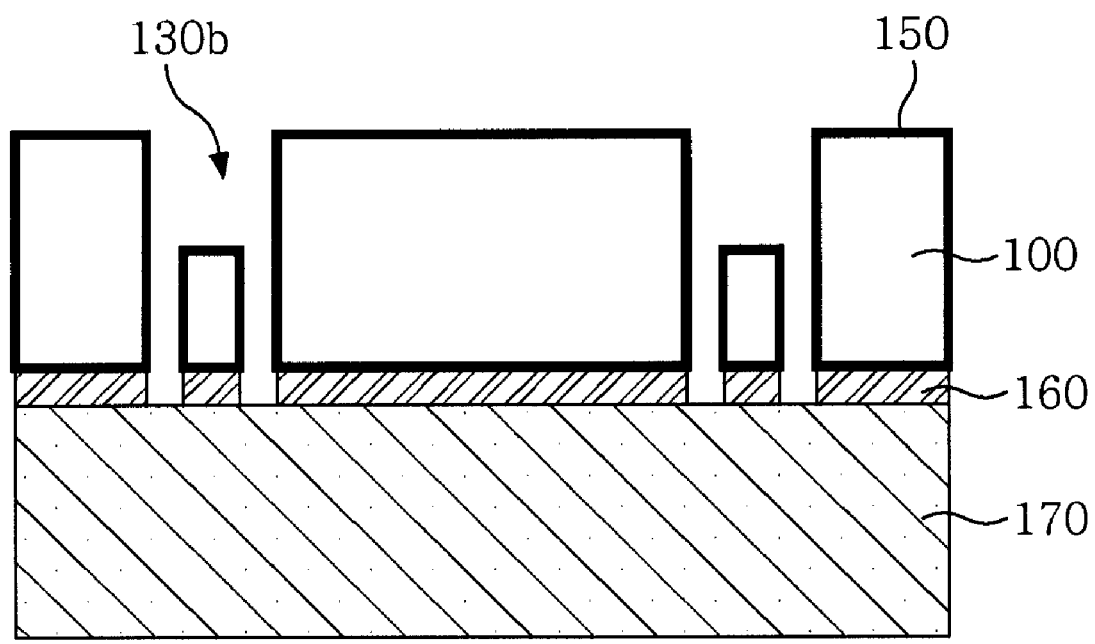

Referring to FIG. 1d, a bonding layer 160 is formed on the second surface 100b of the sacrificial substrate 100. Thereafter, an insulating substrate 170 is bonded to the second surface 100b of the sacrificial substrate 100. It is preferable that the insulating substrate 170 comprises one of a ceramic substrate, a glass substrate and an insulating silicon substrate.

Figure 1E:
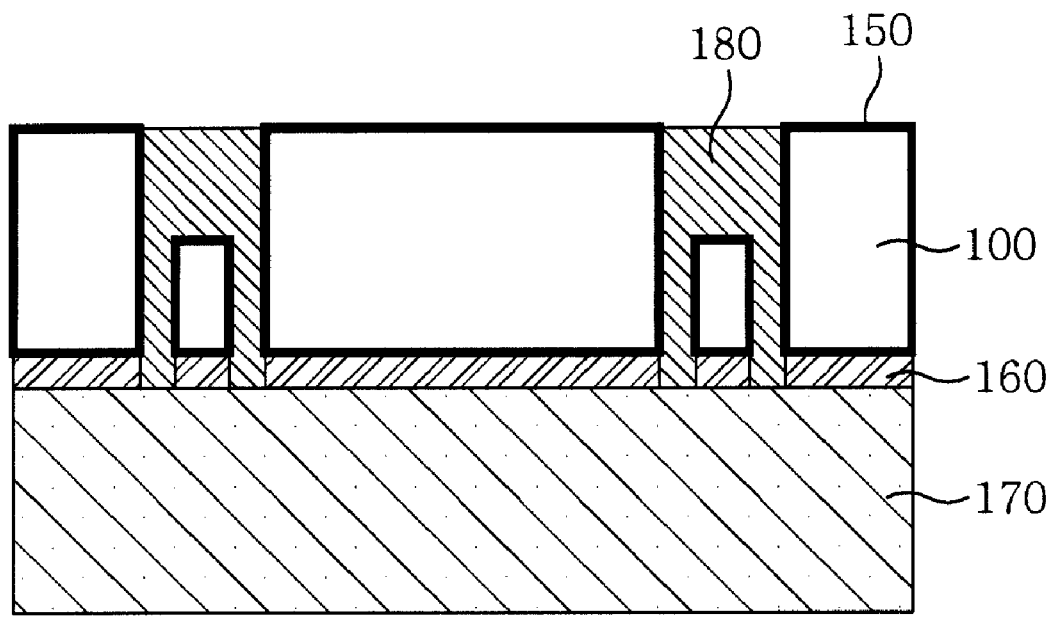

Referring to FIG. 1e, the first bump region 130a and the second bump region 140a are filled up to form the first bump 180a and the second bump 180b, respectively. It is preferable that the first bump 180a and the second bump 180b comprise a conductive material such as a metal.

Figure 1F:
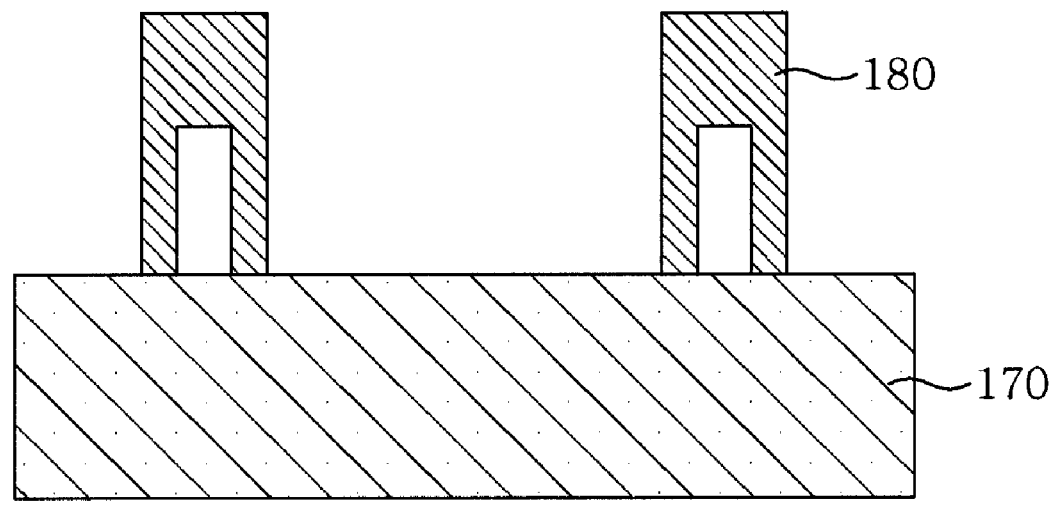

Referring to FIG. 1f, the sacrificial substrate 100 is removed to complete the formation of the bumps.

Although not shown, a cantilever beam may be attached to the bumps to form a cantilever structure.

FIGS. 3a through 3f are cross-sectional views illustrating a method for manufacturing a bump of a probe card in accordance with a second embodiment of the present invention.

Figure 3A:
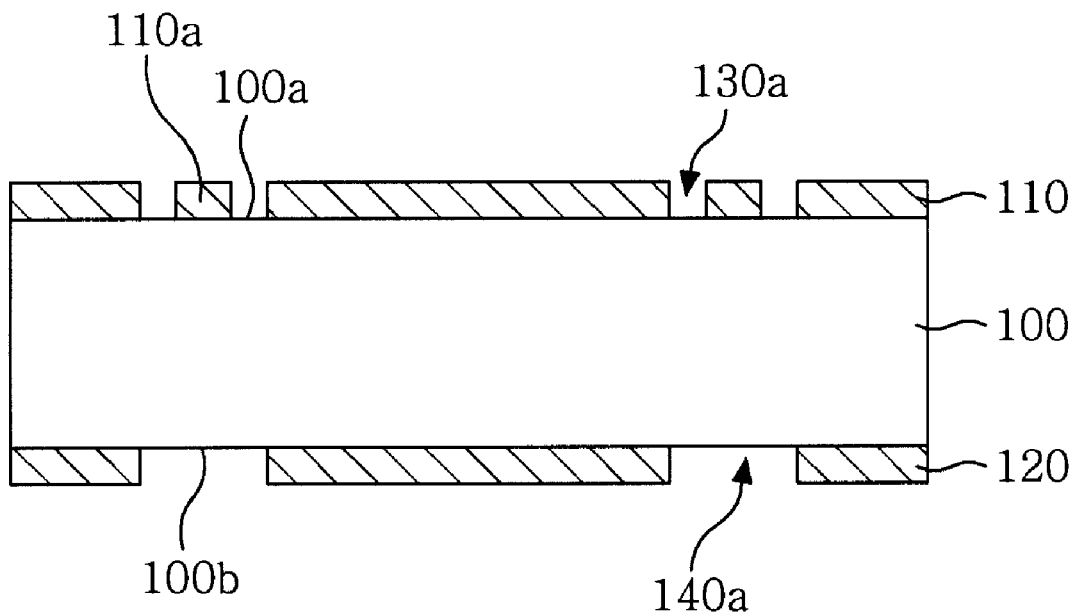
FIGS. 3a through 3f are cross-sectional views illustrating a method for manufacturing a bump of a probe card in accordance with a second embodiment of the present invention.

Referring to FIG. 3a, a first mask layer (not shown) and a second mask layer (not shown) are formed on a first surface 100a and a second surface 100b of a sacrificial substrate 100. It is preferable that the first mask layer and the second mask layer comprise a photoresist film or a TEOS layer.

Thereafter, the first mask layer and the second mask layer are selectively etched to form a first mask layer pattern 110 and a second mask layer pattern 120, respectively. The first mask layer pattern 110 at least exposes a portion of a first bump region 130a of the first surface 100a of the sacrificial substrate 100 where a first bump 180a is to be formed. The second mask layer pattern 120 exposes a second bump region 140a of the second surface 100b of the sacrificial substrate 100 where a second bump 180b is to be formed corresponding to the first bump region 130a.

Similar to the first mask layer pattern 110 and the second mask layer pattern 120 shown in FIGS. 2a and 2b, the first mask layer pattern 110 comprises a first mask portion 110a extending from a first side to a second side of the first bump region 130a. The first mask portion 110a serves as an etching mask during an etching process of the sacrificial substrate 100.

Figure 3B:
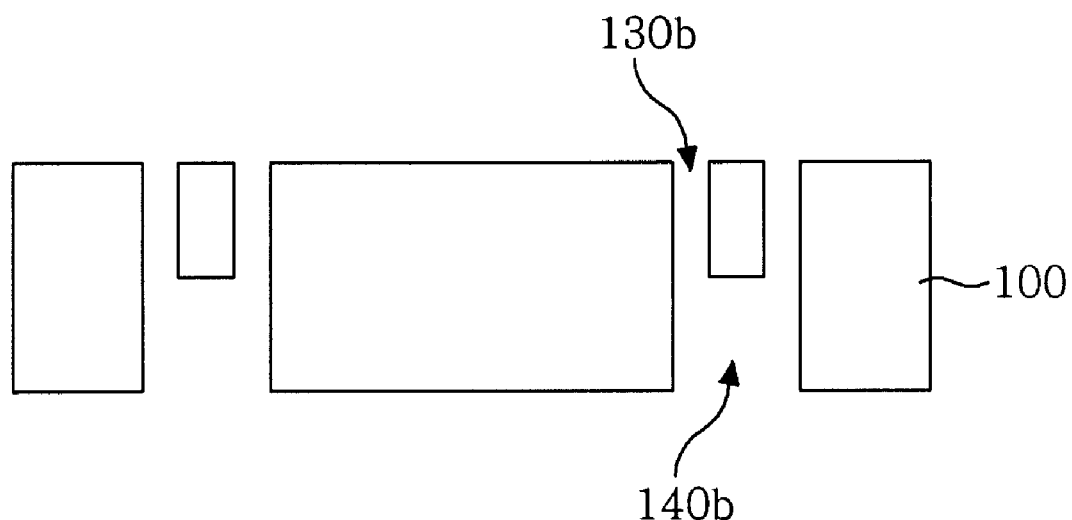

Referring to FIG. 3b, the sacrificial substrate 100 exposed by the first mask layer pattern 110 and the second mask layer pattern 120 is etched to form the first bump region 130a and the second bump region 140a mutually connected.

In the etching process, a first predetermined depth of the sacrificial substrate 100 in the first bump region 130a is etched, and a second predetermined depth of the sacrificial substrate 100 in the second bump region 140a is etched until the first bump region 130a is exposed to form the mutually connected the first bump region 130a and the second bump region 140a.

Thereafter, the first mask layer pattern 110 and the second mask layer pattern 120 are removed.

Figure 3C:
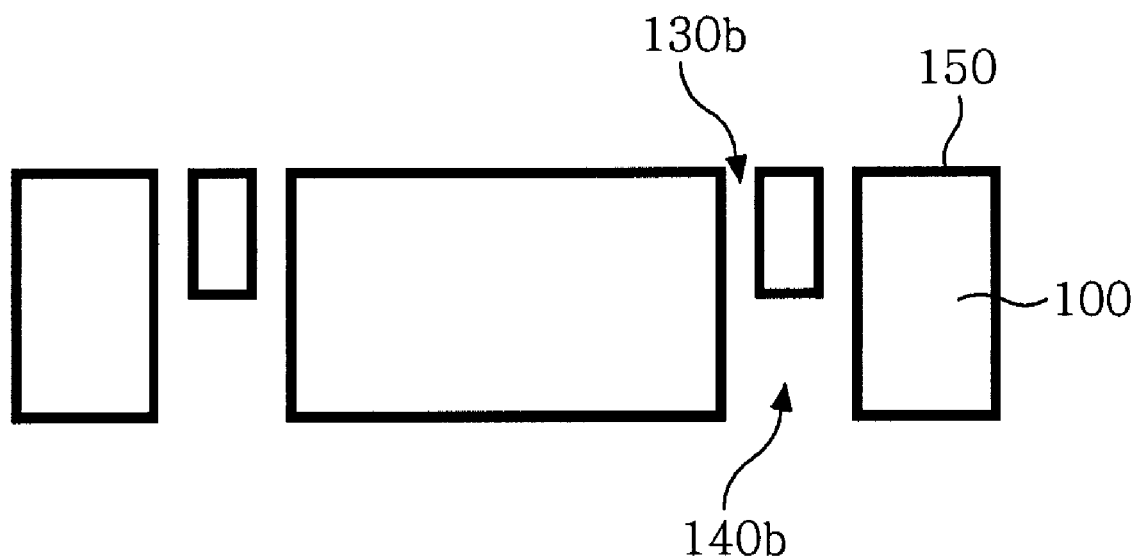

Referring to FIG. 3c, an insulating film 150 is formed on the surfaces of the sacrificial substrate 100. Preferably, the insulating film 150 comprises a nitride film or an oxide film.

Figure 3D:
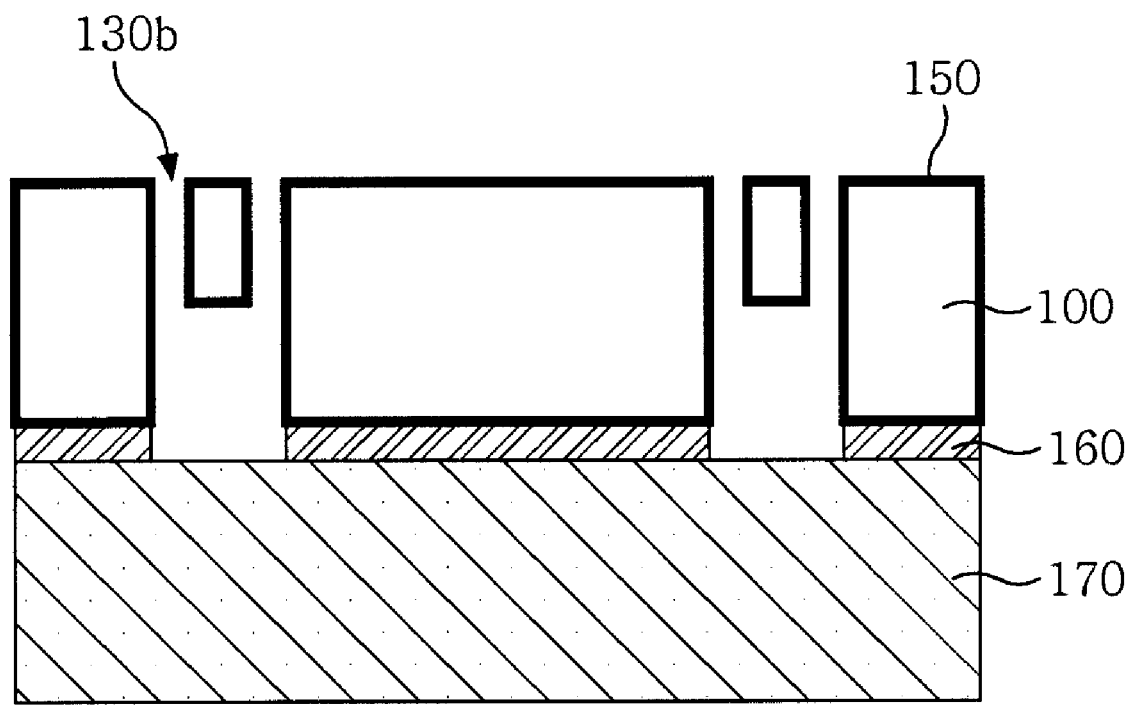

Referring to FIG. 3d, a bonding layer 160 is formed on the second surface 100b of the sacrificial substrate 100. Thereafter, an insulating substrate 170 is bonded to the second surface 100b of the sacrificial substrate 100. It is preferable that the insulating substrate 170 comprises one of a ceramic substrate, a glass substrate and an insulating silicon substrate.

A bonding surface to which the cantilever structure 170 is bonded is opposite to that of the boding process shown in FIG. 1d. That is, while the insulating substrate 170 is bonded to the second surface 100b in the bonding process shown in FIG. 1d, the insulating substrate 170 is bonded to the second surface 100b corresponding to the first surface 100a of FIG. 1d.

Figure 3E:
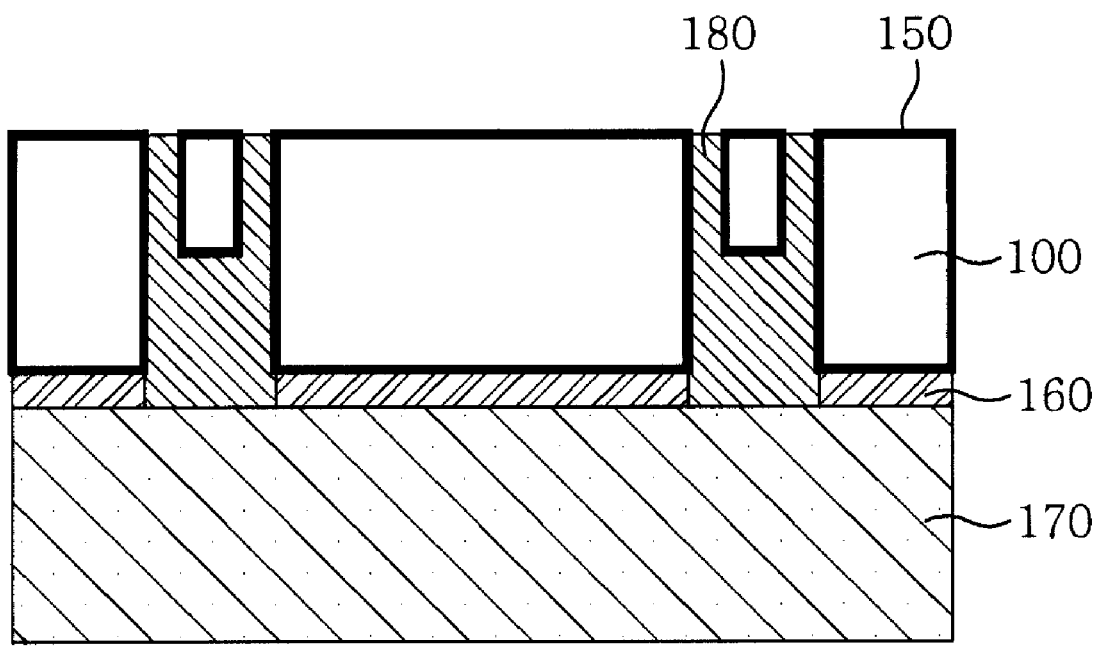

Referring to FIG. 3e, the first bump region 130a and the second bump region 140a are filled up to form the first bump 180a and the second bump 180b, respectively. It is preferable that the first bump 180a and the second bump 180b comprise a conductive material such as a metal.

Figure 3F:
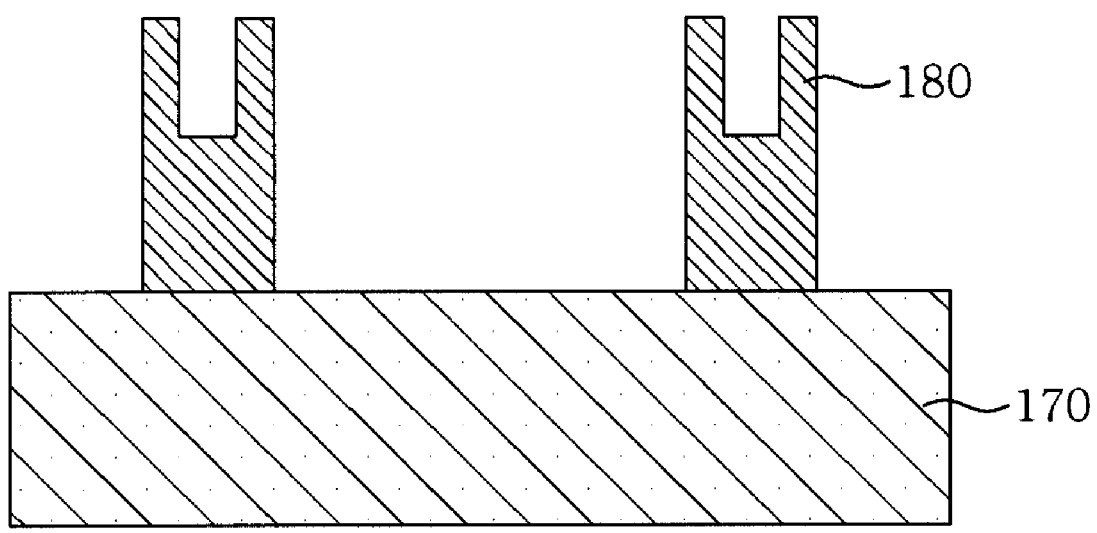

Referring to FIG. 3f, the sacrificial substrate 100 is removed to complete the formation of the bumps.

Although not shown, a cantilever beam may be attached to the bumps to form a cantilever structure.

FIGS. 4a through 4f are cross-sectional views illustrating a method for manufacturing a bump of a probe card in accordance with a third embodiment of the present invention.

Figure 4A:
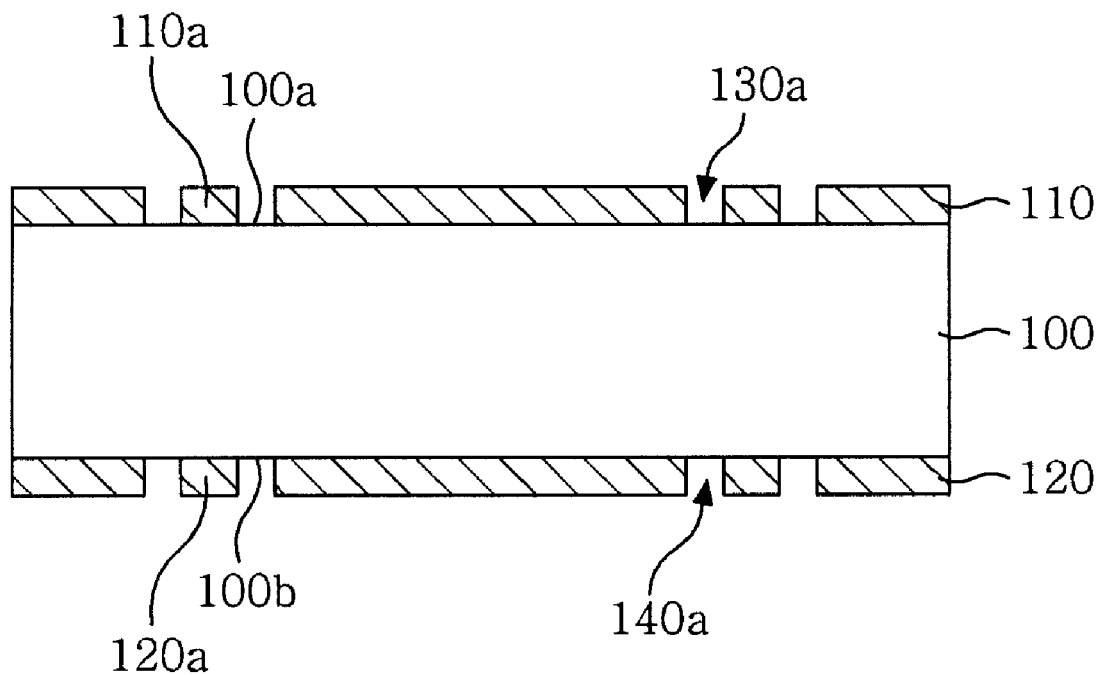
FIGS. 4a through 4f are cross-sectional views illustrating a method for manufacturing a bump of a probe card in accordance with a third embodiment of the present invention.

Referring to FIG. 4a, a first mask layer (not shown) and a second mask layer (not shown) are formed on a first surface 100a and a second surface 100b of a sacrificial substrate 100. It is preferable that the first mask layer and the second mask layer comprise a photoresist film or a TEOS layer.

Thereafter, the first mask layer and the second mask layer are selectively etched to form a first mask layer pattern 110 and a second mask layer pattern 120, respectively. The first mask layer pattern 110 at least exposes a portion of a first bump region 130a of the first surface 100a of the sacrificial substrate 100 where a first bump 180a is to be formed. The second mask layer pattern 120 exposes at least a portion of a second bump region 140a of the second surface 100b of the sacrificial substrate 100 where a second bump 180b is to be formed corresponding to the first bump region 130a.

Similar to the structure shown in FIG. 2b, the first mask layer pattern 110 comprises a first mask portion 110a extending from a first side to a second side of the first bump region 130a. The second mask layer pattern 120 comprises a second mask portion 120a extending from a first side to a second side of the second bump region 140a. The first mask portion 110a and the second mask portion 120a serve as an etching mask during an etching process of the sacrificial substrate 100.

Figure 4B:
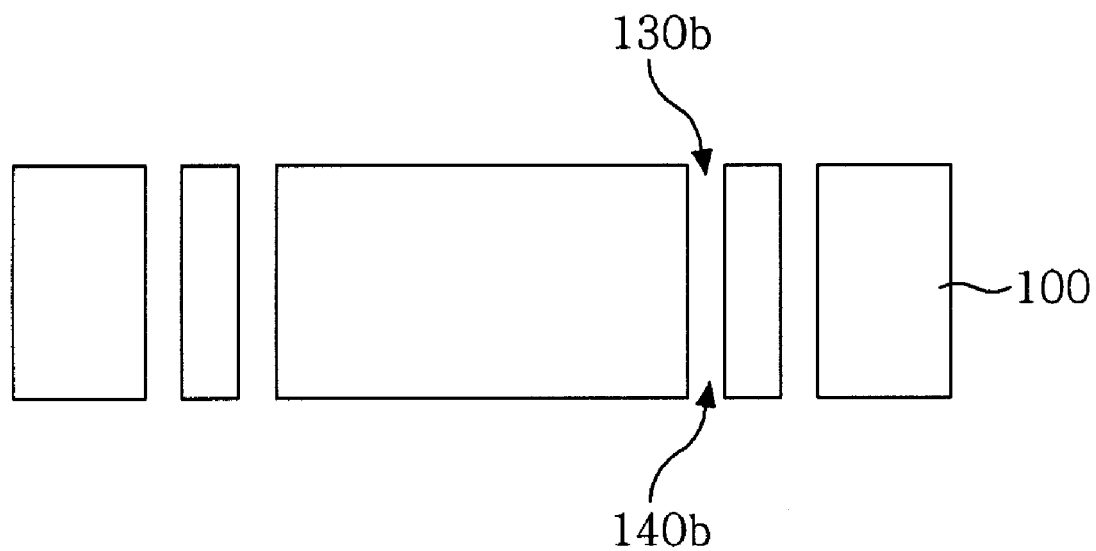

Referring to FIG. 4b, the sacrificial substrate 100 exposed by the first mask layer pattern 110 and the second mask layer pattern 120 is etched to form the first bump region 130a and the second bump region 140a mutually connected.

In the etching process, a first predetermined depth of the sacrificial substrate 100 in the first bump region 130a is etched, and a second predetermined depth of the sacrificial substrate 100 in the second bump region 140a is etched until the first bump region 130a is exposed to form the mutually connected the first bump region 130a and the second bump region 140a.

Thereafter, the first mask layer pattern 110 and the second mask layer pattern 120 are removed.

Figure 4C:
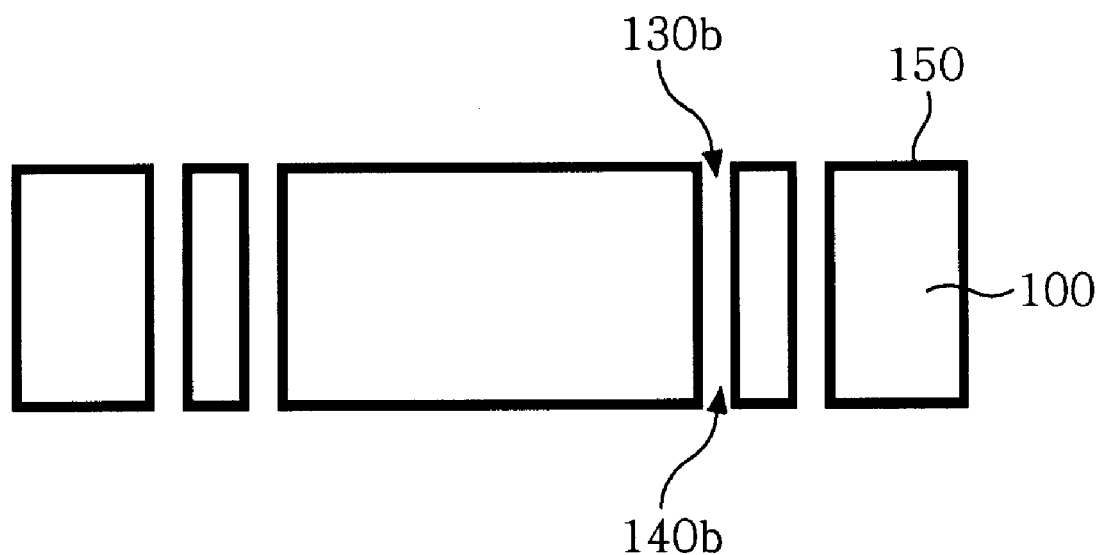

Referring to FIG. 4c, an insulating film 150 is formed on the surfaces of the sacrificial substrate 100. Preferably, the insulating film 150 comprises a nitride film or an oxide film.

Figure 4D:
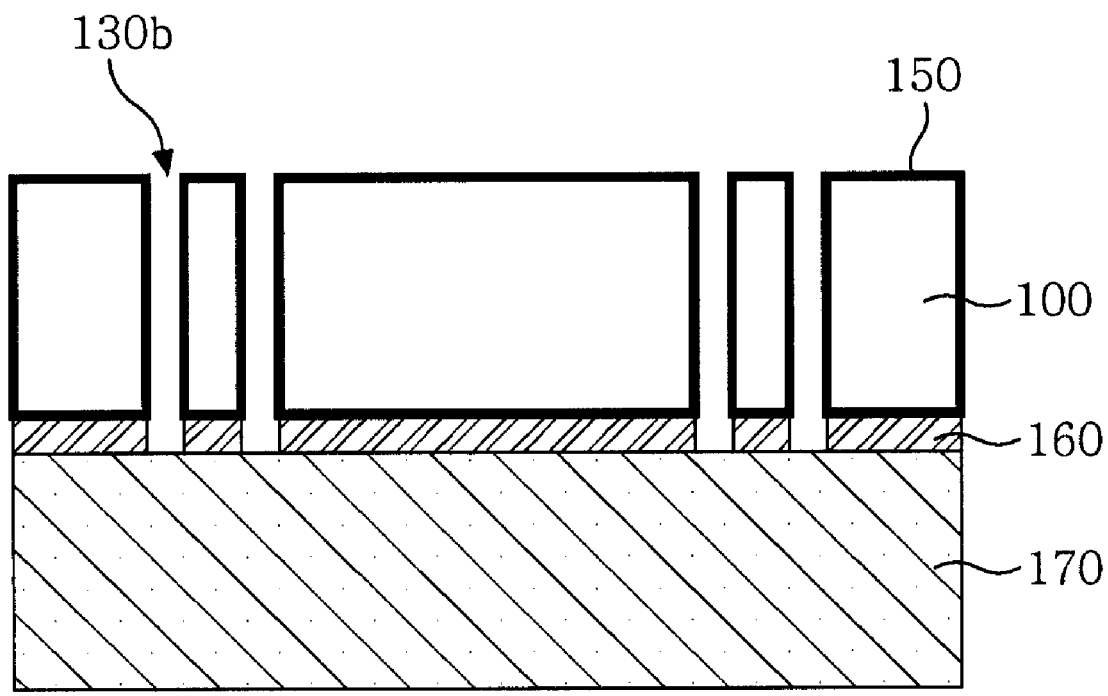

Referring to FIG. 4d, a bonding layer 160 is formed on the second surface 100b of the sacrificial substrate 100. Thereafter, an insulating substrate 170 is bonded to the second surface 100b of the sacrificial substrate 100. It is preferable that the insulating substrate 170 comprises one of a ceramic substrate, a glass substrate and an insulating silicon substrate.

Figure 4E:
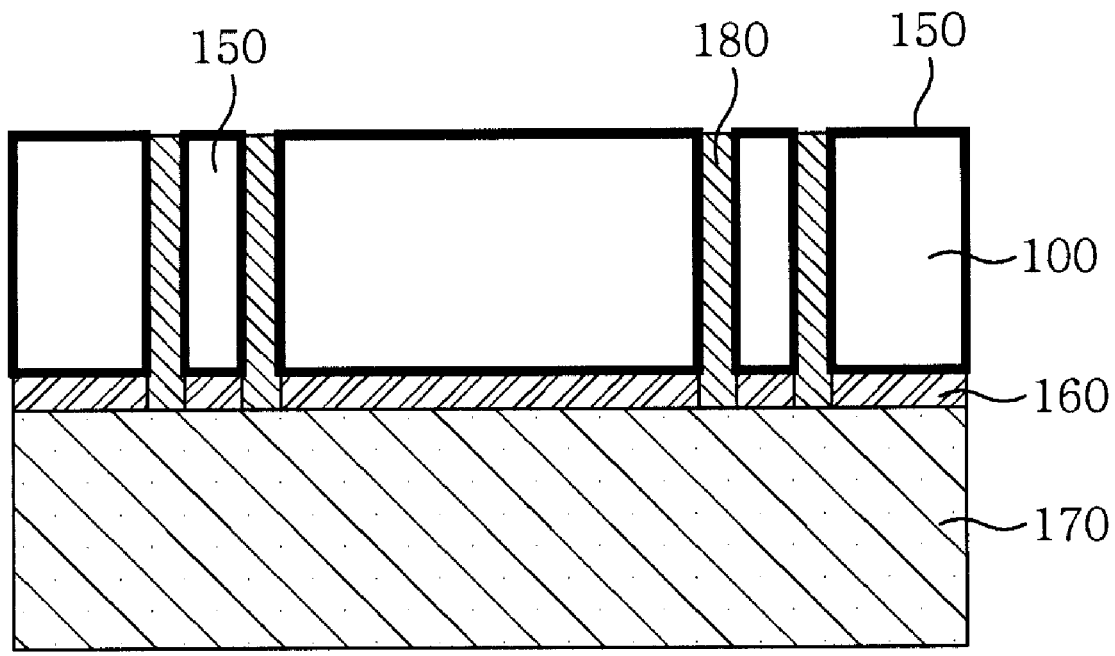

Referring to FIG. 4e, the first bump region 130a and the second bump region 140a are filled up to form the first bump 180a and the second bump 180b, respectively. It is preferable that the first bump 180a and the second bump 180b comprise a conductive material such as a metal.

Figure 4F:
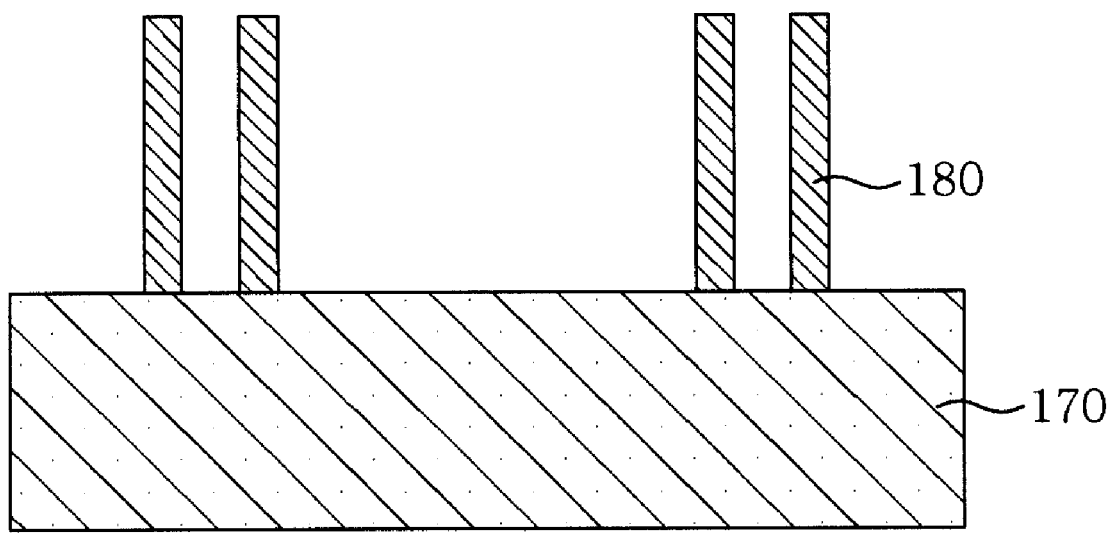

Referring to FIG. 4f, the sacrificial substrate 100 is removed to complete the formation of the bumps.

Although not shown, a cantilever beam may be attached to the bumps to form a cantilever structure.

As described above, the method of the present invention provides the bump having a shape of Π or ΙΙ suitable for testing of a high speed device, superior elasticity, durability and the high aspect ratio.

What is claimed is:

1. A method for manufacturing a bump of a probe card, the method comprising steps of:
   (a) forming first and second mask layer patterns on a first and second surfaces of a sacrificial substrate respectively, the first and second mask layer patterns exposing at least a portion of a first bump region where a first bump is to be formed and at least a portion of a second bump region where a second bump is to be formed corresponding to the first bump region, respectively;
   (b) removing the sacrificial substrate exposed by the first and second mask layer patterns to form the first bump region and the second bump region mutually connected, respectively;
   (c) removing the first and second mask layer patterns;
   (d) bonding an insulating substrate to one of the first and second surfaces of the sacrificial substrate;
   (e) forming first and second bumps filling the first and second bump regions, respectively; and
   (f) removing the sacrificial substrate.

2. The method in accordance with claim 1, wherein the first mask layer pattern comprises a first mask portion extending from a first side to a second side of the first bump region so as to expose a portion of the first bump region, and the second mask layer pattern comprises a second mask portion extending from a first side to a second side of the second bump region so as to expose a portion of the second bump region.

3. The method in accordance with claim 1, wherein the first mask layer pattern comprises a first mask portion extending from a first side to a second side of the first bump region so as to expose a portion of the first bump region, and the second mask layer pattern exposes an entirety of the second bump region, and wherein the insulating substrate is bonded to the second surface of the sacrificial substrate.

4. The method in accordance with claim 1, wherein the first mask layer pattern exposes an entirety of the first bump region, the second mask layer pattern comprises a second mask portion extending from a first side to a second side of the second bump region so as to expose a portion of the second bump region, and wherein the insulating substrate is bonded to the second surface of the sacrificial substrate.

5. The method in accordance with claim 1, further comprising forming an insulating film on the surfaces of the sacrificial substrate.

6. The method in accordance with claim 1, further comprising forming a bonding layer at an interface of the sacrificial layer and the insulating substrate.

7. The method in accordance with claim 1, wherein the insulating substrate comprises one of a ceramic substrate, a glass substrate and an insulating silicon substrate.

8. The method in accordance with claim 1, wherein each of the first and second mask layer patterns comprises one of a photoresist film and a TEOS film.

9. The method in accordance with claim 1, wherein the sacrificial substrate comprises one of a silicon substrate and a glass substrate.

* * * * *